US010692567B2

(12) United States Patent
Chou et al.

(10) Patent No.: US 10,692,567 B2
(45) Date of Patent: Jun. 23, 2020

(54) METHOD FOR ASSISTING MEMORY CELL IN ACCESS OPERATION AND OPERATING MEMORY CELL, AND MEMORY DEVICE HAVING ASSIST CIRCUIT WITH PREDEFINED ASSIST STRENGTH

(71) Applicant: M31 TECHNOLOGY CORPORATION, Hsinchu County (TW)

(72) Inventors: Zhi-Xian Chou, Pingtung County (TW); Wei-Chiang Shih, Hsinchu County (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 166 days.

(21) Appl. No.: 16/123,459

(22) Filed: Sep. 6, 2018

(65) Prior Publication Data

US 2020/0082875 A1     Mar. 12, 2020

(51) Int. Cl.
    *G11C 11/419*     (2006.01)
    *G11C 8/08*     (2006.01)
    *G11C 7/12*     (2006.01)

(52) U.S. Cl.
    CPC .............. *G11C 11/419* (2013.01); *G11C 7/12* (2013.01); *G11C 8/08* (2013.01)

(58) Field of Classification Search
    CPC ............ G11C 11/419; G11C 7/12; G11C 8/08
    USPC .................................. 365/189.011; 711/154
    See application file for complete search history.

(56) References Cited

U.S. PATENT DOCUMENTS

| 6,456,547 | B1* | 9/2002 | Mo ........................ G11C 7/12 |
| | | | 365/200 |
| 8,472,271 | B2 | 6/2013 | Dawson et al. |
| 8,724,373 | B2 | 5/2014 | Garg et al. |
| 9,230,636 | B2 | 1/2016 | Meinerzhagen et al. |
| 9,324,392 | B1 | 4/2016 | Asenov et al. |
| 9,368,228 | B2 | 6/2016 | Kawasumi |
| 9,583,178 | B2 | 2/2017 | Jung et al. |
| 9,697,877 | B2 | 7/2017 | Shanbhag et al. |

OTHER PUBLICATIONS

Notice of Allowance and Search Report dated Jun. 12, 2019 issued by Taiwan Intellectual Property Office for counterpart application 107140244.

* cited by examiner

*Primary Examiner* — Harry W Byrne
(74) *Attorney, Agent, or Firm* — WPAT, P.C., Intellectual Property Attorneys; Anthony King

(57) ABSTRACT

A method for assisting a memory cell in an access operation is provided. The method includes: setting a supply voltage to a first supply voltage level to determine a reference probability value of the memory cell applied by the first supply voltage level; applying an assist voltage to an access line coupled to the memory cell, and setting the supply voltage to a second supply voltage level to determine a relationship between the assist voltage and the access failure probability of the memory cell applied by the second supply voltage level; determining, from the relationship, a target assist voltage level of the assist voltage corresponding to the reference probability value; and providing an assist circuit configured to apply the target assist voltage level to the access line during the access operation, wherein the memory cell is applied by the second supply voltage level during the access operation.

20 Claims, 7 Drawing Sheets

| Low supply voltage scenario | LS2 | LS1 |
|---|---|---|
| Nominal supply voltage level (V) | 2.0 | 1.5 |
| Target supply voltage level (V) | 1.8 | 1.35 |
| Predetermined voltage drop for R/W assists (mV) | 50/100 | 100/200 |
| Minimum permissible supply voltage level without R/W assists (V) | 1.85/1.9 | 1.45/1.55 |

FIG. 1

METHOD FOR ASSISTING MEMORY CELL IN ACCESS OPERATION AND OPERATING MEMORY CELL, AND MEMORY DEVICE HAVING ASSIST CIRCUIT WITH PREDEFINED ASSIST STRENGTH

BACKGROUND

The present disclosure relates to memory access, and more particularly, to a method for assisting a memory cell in an access operation, a memory device having an assist circuit capable of providing a target assist voltage, and a method for operating a memory cell.

Static random access memory (SRAM) devices have become increasingly popular in various applications, such as communication, image processing and other system-on-chip (SOC) applications, which require high speed operation and low power dissipation. Reduction in the supply voltage reduces the dynamic power dissipation but renders an SRAM cell unstable. For example, low supply voltages reduce the static noise margin (SNM), which is the most commonly used metric for SRAM cell stability. When an external noise is larger than the SNM, a state of the SRAM cell can change and stored data is lost. In addition, process variations in deeply scaled CMOS technologies further degrades the SRAM cell stability.

SUMMARY

The described embodiments provide a method for assisting a memory cell in an access operation, a memory device having an assist circuit with predefined assist strength, and a method for operating a memory cell.

Some embodiments described herein include a method for assisting a memory cell in an access operation. The access operation is activated in response to a supply voltage supplied to the memory cell. The method includes: setting the supply voltage to a first supply voltage level to determine a reference probability value, the reference probability value representing an access failure probability of the memory cell applied by the first supply voltage level; applying an assist voltage to an access line coupled to the memory cell, and setting the supply voltage to a second supply voltage level to determine a relationship between the assist voltage and the access failure probability of the memory cell applied by the second supply voltage level, the second supply voltage level being different from the first supply voltage level; determining, from the relationship, a target assist voltage level of the assist voltage corresponding to the reference probability value; and providing an assist circuit configured to apply the target assist voltage level to the access line during the access operation, wherein the memory cell is applied by the second supply voltage level during the access operation.

Some embodiments described herein include a memory circuit. The memory circuit includes an access line, a memory cell, a control circuit and an assist circuit. The memory cell is coupled to the access line, wherein an access failure probability of the memory cell is equal to a reference probability value when the memory cell is applied by a supply voltage at a first supply voltage level. The control circuit, coupled to the memory cell, is configured to provide the supply voltage to the memory cell to activate an access operation, wherein during the access operation, the control circuit is configured to apply the supply voltage at a second supply voltage level to the memory cell, and the second supply voltage level is different from the first supply voltage level. The assist circuit is coupled to the access line, wherein during the access operation, the assist circuit is configured to apply an assist voltage having a target assist voltage level to the access line, such that the access failure probability of the memory cell applied by the second supply voltage level is equal to the reference probability value.

Some embodiments described herein include a method for operating a memory cell. The memory cell is supplied by a supply voltage to activate an access operation. The method includes determining a reference probability value of the memory cell, the reference probability value representing an access failure probability of the memory cell applied by the supply voltage at a first supply voltage level; applying an assist voltage to an access line coupled to the memory cell, and determining a relationship between the assist voltage and the access failure probability of the memory cell applied by the supply voltage at a second supply voltage level, the second supply voltage level being different from the first supply voltage level; determining, from the relationship, a target assist voltage level of the assist voltage corresponding to the reference probability value; and applying the assist voltage having the target assist voltage level to the access line, and supplying the supply voltage at the second supply voltage level to the memory cell to perform the access operation.

With the use of the assist scheme capable of optimizing assist strength in different low supply voltage scenarios, memory devices can operate at low supply voltage levels with improved power efficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a diagram illustrating exemplary supply voltage drops required for an SRAM bit cell operating in different low supply voltage scenarios in accordance with some embodiments.

DETAILED DESCRIPTION

Figure 2:
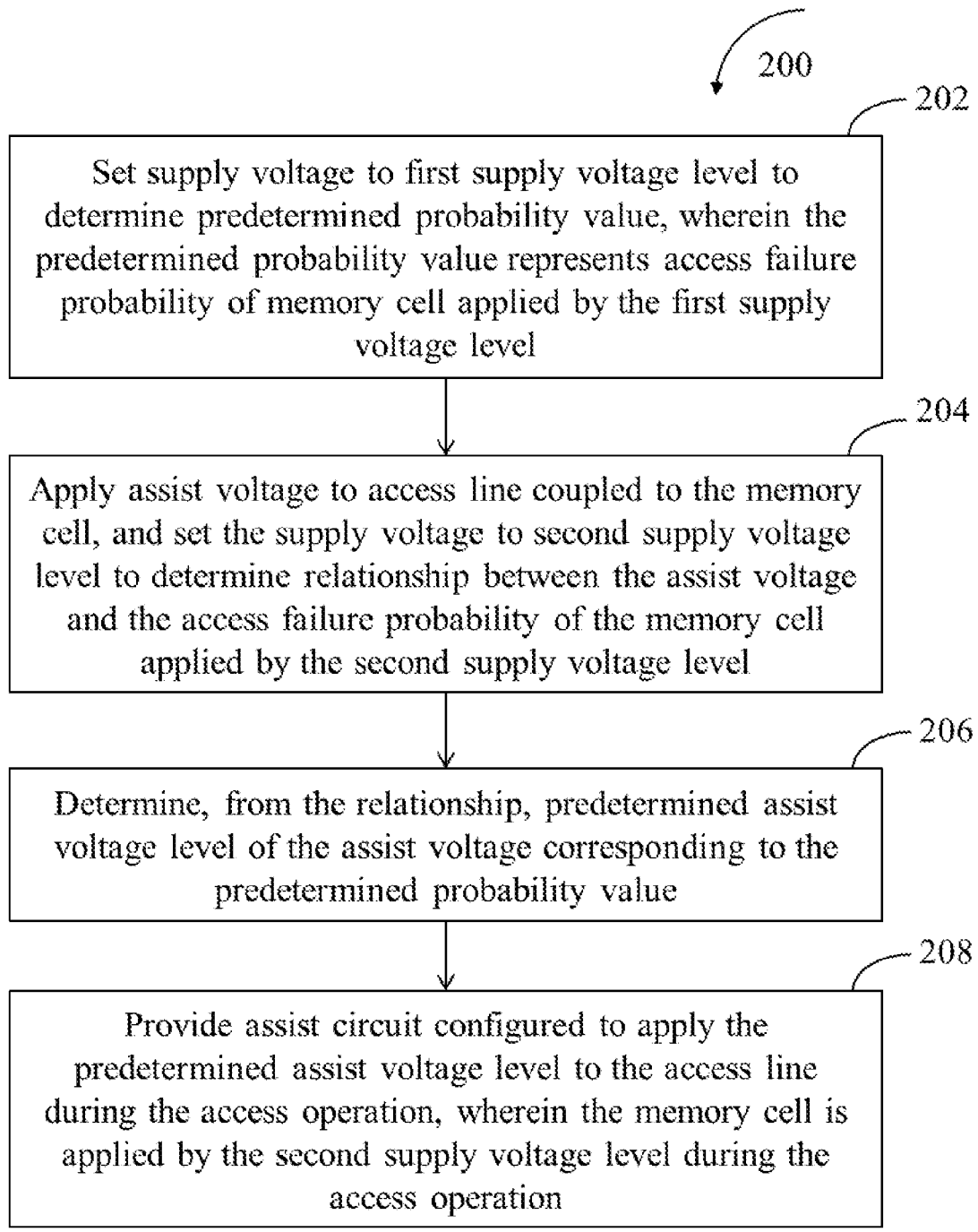
FIG. 2 is a flowchart of an exemplary method for assisting a memory cell in an access operation in accordance with some embodiments of the present disclosure.

The following disclosure provides many different embodiments, or examples, for implementing different features of the provided subject matter. Specific examples of parameter values, components and arrangements are described below to simplify the present disclosure. These are, of course, merely examples and are not intended to be limiting. For example, parameter values in the description that follows may vary depending on a given technology node such as an advanced CMOS technology node, an advanced FinFET technology node or other semiconductor technology nodes. As another example, parameter values for a given technology node may vary depending on a given application or operating scenario. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

To improve noise margins for lower supply voltage scenarios, SRAM devices may employ access assist techniques to assist memory cells, or bit cells, in access operations. For example, regarding read operations, an SRAM device may utilize a wordline under-drive (WLUD) technique or a wordline level reduction (WLR) technique to improve read stability. A read assist circuit utilizing the WLUD technique is configured to reduce a voltage level of an activated wordline to a level lower than a supply voltage level, thus reducing a current flowing through a pass transistor coupled to the activated wordline during a read operation. This can improve the immunity of a memory cell to noise, which may disturb a storage node of the memory cell during the read operation and cause data loss.

Regarding write operations, an SRAM device may utilize, for example, a negative bitline (NBL) boost technique to improve write stability. A write assist circuit utilizing the NBL boost technique is configured to reduce a voltage level of a bitline to a level below zero volt, thus creating a larger gate-to-source voltage of a pass transistor coupled to the bitline during a write operation. This improves a write current and write ability of a memory cell.

FIG. 1 is a diagram illustrating exemplary supply voltage drops required for an SRAM bit cell operating in different low supply voltage scenarios in accordance with some embodiments. As shown in FIG. 1, in a low supply voltage scenario LS1 where a nominal supply voltage level is 1.5V, a minimum permissible level of a supply voltage supplied to the SRAM bit cell may be 1.35V, which is 90% of the nominal supply voltage level and hereinafter referred to as a target supply voltage level. However, when the SRAM bit cell operates at the supply voltage of 1.35V without any read and write assists, respective minimum permissible levels of the supply voltage for read and write operations are 1.45V and 1.55V. As a result, the SRAM bit cell needs a read assist circuit which can help the minimum permissible level of the supply voltage reduce from 1.45V to 1.35V (a predetermined supply voltage drop of 100 mV) in the read operations, and a write assist circuit which can help the minimum permissible level of the supply voltage reduce from 1.55V to 1.35V (a predetermined supply voltage drop of 200 mV) in the write operations. Similarly, in a low supply voltage scenario LS2 where a nominal supply voltage level is 2.0V, the SRAM bit cell needs a read assist circuit which can help the minimum permissible level of the supply voltage reduce from 1.85V to 1.8V (a predetermined supply voltage drop of 50 mV) in the read operations, and a write assist circuit which can help the minimum permissible level of the supply voltage reduce from 1.9V to 1.8V (a predetermined supply voltage drop of 100 mV) during the write operations.

However, as failing to determine assist strength of a read/write assist circuit, existing access assist techniques will often overestimate a decrease in wordline/bitline voltage that the read/write assist circuit should provide. For example, in the low supply voltage scenario LS1 shown in FIG. 1, the read assist circuit is designed to reduce the wordline voltage by more than 100 mV in order to ensure the SRAM bit cell can operate at the minimum permissible level (1.35V), causing unnecessary power consumption.

The present disclosure describes exemplary methods and memory devices capable of determining assist strength of an assist circuit, such as a decrease in wordline/bitline voltage that a read/write assist circuit can provide. Hence, the exemplary methods and memory devices can optimize the assist strength of the access assist circuit in different low supply voltage scenarios, thus reducing unnecessary power consumption. Further description is provided below.

FIG. 2 is a flowchart of an exemplary method for assisting a memory cell in an access operation in accordance with some embodiments of the present disclosure. The access operation is activated in response to a supply voltage supplied to the memory cell. For illustrative purposes, the method 200 is described with reference to design specifications for the low supply voltage scenario LS1 shown in FIG. 1. Those skilled in the art will recognize that the method 200 can be utilized to define assist strength for other design specifications without departing from the scope of the present disclosure. Additionally, in some embodiments, other operations in the method 200 can be performed. In some embodiments, operations of the method 200 can be performed in a different order and/or vary.

At operation 202, the supply voltage is set to a first supply voltage level to determine a reference probability value of the memory cell. The reference probability value represents an access failure probability of the memory cell applied by the first supply voltage level. For example, the minimum permissible supply voltage level for read/write operations shown in FIG. 1, i.e. 1.45V/1.55V, is applied to the memory cell to determine the access failure probability of the memory cell without read/write assists.

At operation 204, an assist voltage is applied to an access line coupled to the memory cell, and the supply voltage is set to a second supply voltage level to determine a relationship between the assist voltage and the access failure probability of the memory cell applied by the second supply voltage level. The second supply voltage level is different from the first supply voltage level. For example, the assist voltage is applied to a wordline/bitline coupled the memory cell, and the target supply voltage level shown in FIG. 1, i.e. 1.35V, is applied to the memory cell to determine the relationship between the assist voltage and the access failure probability of the memory cell with read/write assists.

At operation 206, a target assist voltage level of the assist voltage, corresponding to the reference probability value, is determined from the relationship between the assist voltage and the access failure probability. For example, the reference probability value, which is the access failure probability of the memory cell biased at the supply voltage of 1.45V/1.55V without read/write assists, can be used to determine a target read/write assist voltage level from the relationship between the assist voltage and the access failure probability of the memory cell biased at the supply voltage of 1.35V.

At operation 208, an assist circuit is provided to apply the target assist voltage level to the access line during the access operation. As a result, the memory cell can operate at the second supply voltage level during the access operation without increasing the access failure probability. For example, the assist circuit is configured to apply the target assist voltage level to the wordline/bitline coupled to the memory cell during read/write operations, such that the access failure probability of the memory cell operating at 1.35V is equal or substantially equal to that of the memory cell operating at 1.45V/1.55V without read/write assists. As a result, the assist circuit can assist the memory cell in read/write operations without overestimating read/write assist strength.

Figure 3:
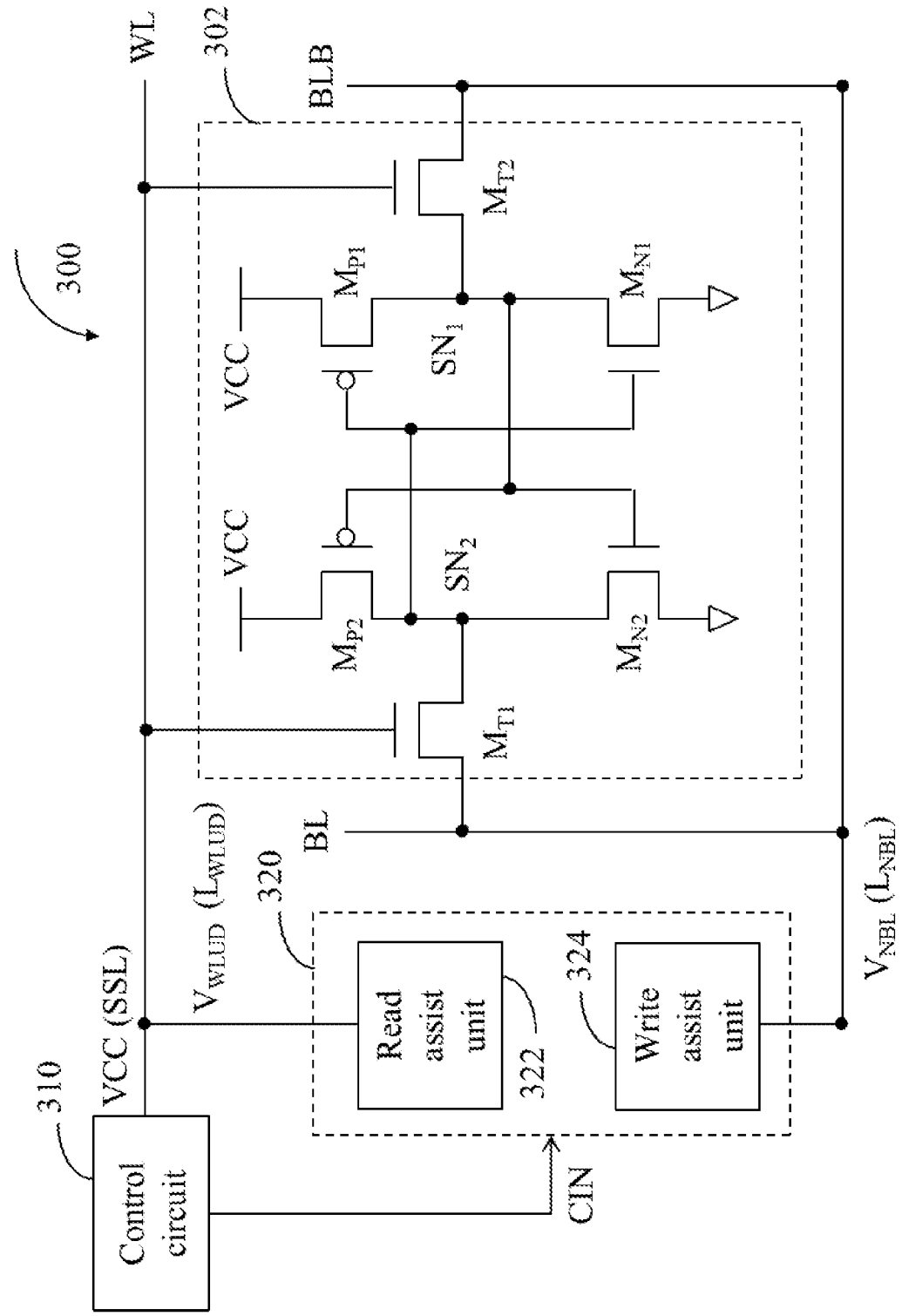
FIG. 3 is a diagram illustrating an exemplary memory circuit 300 according to some embodiments of the present disclosure.

To facilitate understanding of the present disclosure, an embodiment of a memory circuit is given in the following for further description of the access assist scheme capable of providing optimized assist strength. However, those skilled in the art should appreciate that the proposed access assist scheme can be employed in other types of memory circuits without departing from the scope of the present disclosure. FIG. 3 is a diagram illustrating an exemplary memory circuit 300 according to some embodiments of the present disclosure. The memory circuit 300 can be implemented in a single-port, dual-port or multi-port (e.g. two-port) SRAM device. The memory circuit 300 includes, but is not limited to, a plurality of access lines, a memory cell 302, a control circuit 310 and an assist circuit 320. The access lines are arranged for memory access operations such as read operations or write operations. In the present embodiment, the access lines may include a wordline WL and a pair of bitlines, i.e. a bitline BL and a complementary bitline BLB.

The memory cells 302, coupled to the wordline WL, the bitline BL and the complementary bitline BLB, is implemented as a 6T-SRAM bit cell of a memory cell array in the present embodiment for illustrative purposes. The memory cell 302 includes a plurality of transistors $M_{P1}$, $M_{P2}$, $M_{N1}$ and $M_{N2}$. The transistors $M_{P1}$ and $M_{N1}$ form an inverter, and the transistors $M_{P2}$ and $M_{N2}$ form another inverter, wherein these two inverters are cross-coupled between storage nodes $SN_1$ and $SN_2$ for data storage. Please note that the memory cell 302 can employ other SRAM configurations, such as an 8T-SRAM bit cell or a 10T-SRAM bit cell, without departing from the scope of the present disclosure.

The control circuit 310, coupled to the memory cell 302, is configured to provide a supply voltage VCC to the memory cell 302 to activate an access operation. The assist circuit 320, coupled to the wordline WL, the bitline BL and the complementary bitline BLB, is configured to apply an assist voltage to one of the wordline WL, the bitline BL and the complementary bitline BLB, thereby assisting the memory cell 302 in the access operation. By way of example but not limitation, the assist circuit 320 can include a read assist unit 322 and a write assist unit 324. The read assist unit 322 is configured to provide a read assist voltage $V_{WLUD}$ serving as the assist voltage, and apply the read assist voltage $V_{WLUD}$ to the wordline WL to assist the memory cell 302 in a read operation. The write assist unit 324 is configured to provide a write assist voltage $V_{NBL}$ serving as the assist voltage, and apply the write assist voltage $V_{NBL}$ to one of the bitline BL and the complementary bitline BLB to assist the memory cell 302 in a write operation.

During the access operation, the control circuit 310 is configured to apply the supply voltage VCC at a supply voltage level SSL to the memory cell 302. Additionally, the assist circuit 320 is configured to apply the assist voltage having a target assist voltage level to an access line coupled to the memory cell 302, such that an access failure probability of the memory cell 302 applied by the supply voltage level SSL can be equal or substantially equal to a reference probability value. The reference probability value represents the access failure probability of the memory cell 302 which is applied by another supply voltage level different from the supply voltage level SSL. The another supply voltage level may be calculated by adding the supply voltage level SSL and a predetermined supply voltage drop, such as the predetermined supply voltage drop defined for read/write assists shown in FIG. 1.

By way of example but not limitation, the memory circuit 300 operates in the low supply voltage scenario LS1 shown in FIG. 1 to read data stored in the memory cell 302, the control circuit 310 may apply the supply voltage VCC at the target supply voltage level, i.e. 1.35V, to the memory cell 302 through the wordline WL. Also, the read assist unit 322 may apply the read assist voltage $V_{WLUD}$ having a target assist voltage level $L_{WLUD}$ to the wordline WL, such that the read failure probability of the memory cell 302 applied by the target supply voltage level (1.35V) and the target assist voltage level $L_{WLUD}$ can be equal or substantially equal to that of the memory cell 302 applied by the minimum permissible supply voltage level (1.45V) without read assists. The target assist voltage level $L_{WLUD}$ provided by the read assist unit 322 can be regarded as read assist strength, which helps the memory cell 302 satisfy design specifications for read operations in the low supply voltage scenario LS1 shown in FIG. 1. It is worth noting that the target assist voltage level $L_{WLUD}$ can be relatively small compared to the predetermined supply voltage drop defined for read assists (100 mV). This means that the read assist unit 322 can provide assist the memory cell 302 in a read operation without overestimating the read assist strength.

Additionally or alternatively, when the memory circuit 300 operates in the low supply voltage scenario LS1 shown in FIG. 1 to write data "0" into the memory cell 302, the control circuit 310 may apply the supply voltage VCC at the target supply voltage level (1.35V) to the memory cell 302 through the wordline WL. The write assist unit 324 may apply the write assist voltage $V_{NBL}$ having a target assist voltage level $L_{NBL}$ to the bitline BL, such that the write failure probability of the memory cell 302 applied by the target supply voltage level (1.35V) and the target assist voltage level $L_{NBL}$ can be equal or substantially equal to that of the memory cell 302 applied by the minimum permissible supply voltage level (1.55V) without write assists. Similarly, the target assist voltage level $L_{NBL}$ can be relatively small compared to the predetermined supply voltage drop defined for write assists (200 mV). As a result, the write assist unit 324 can provide assist the memory cell 302 in the write operation without overestimating the write assist strength.

Figure 4:
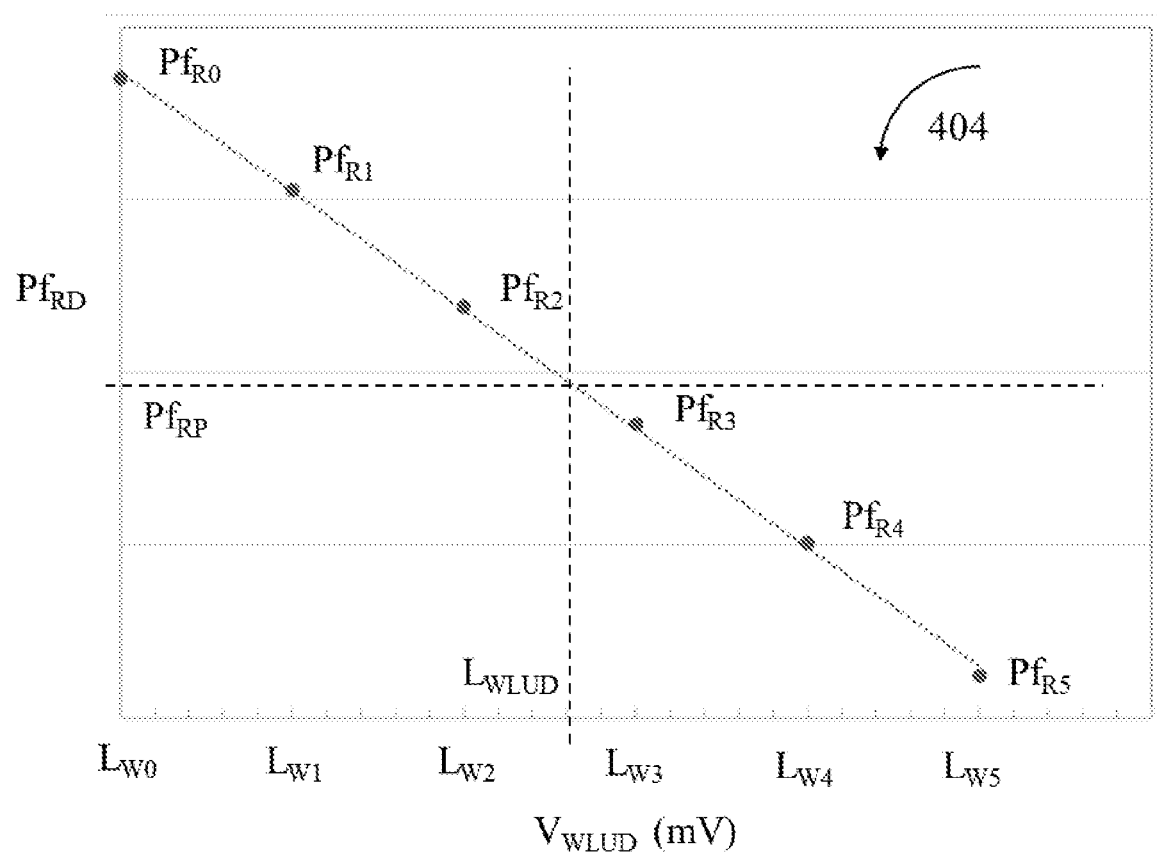
FIG. 4 illustrates determination of the target assist voltage level of the read assist voltage shown in FIG. 3 according to some embodiments of the present disclosure.
Figure 5:
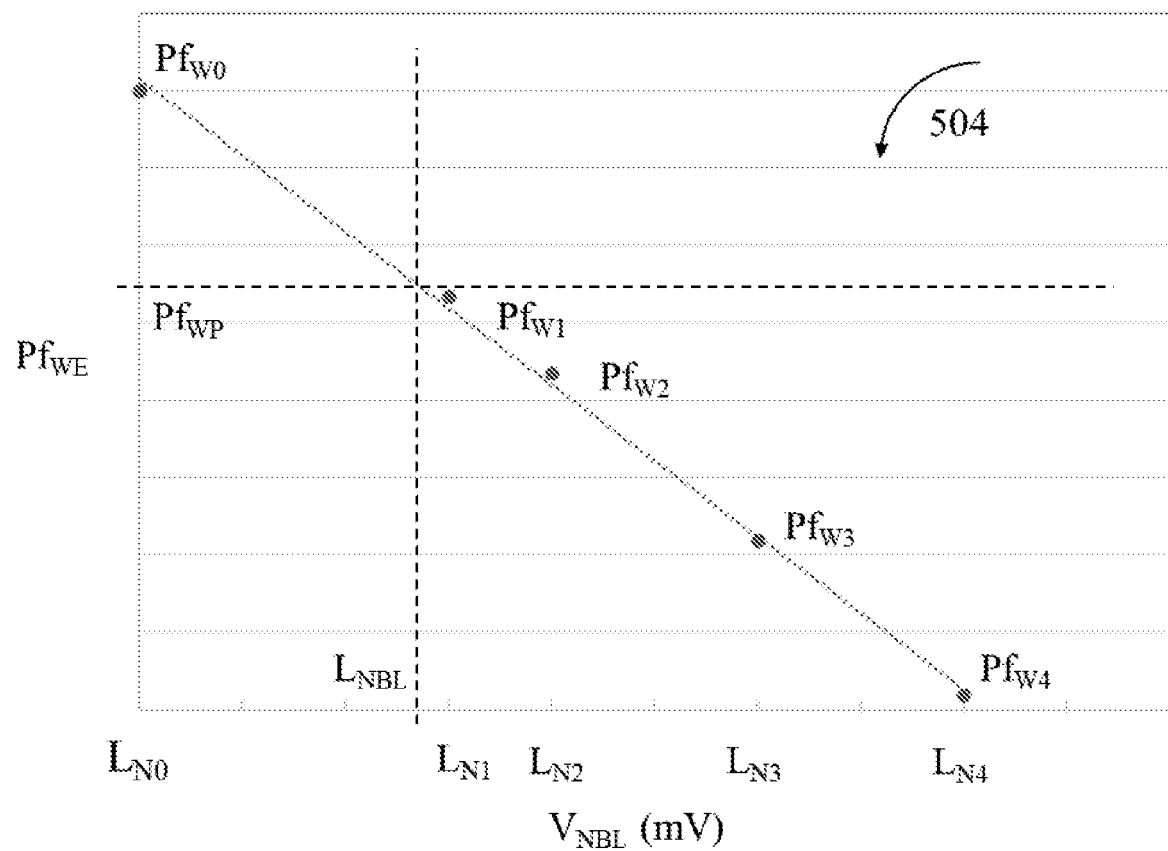
FIG. 5 illustrates determination of the target assist voltage level of the write assist voltage shown in FIG. 3 according to some embodiments of the present disclosure.

FIG. 4 and FIG. 5 illustrate determination of the target assist voltage levels $L_{WLUD}$ and $L_{NBL}$ shown in FIG. 3 according to some embodiments of the present disclosure. Firstly, referring to FIG. 4 and also to FIG. 3, a relationship 404 between the read assist voltage $V_{WLUD}$ and an access failure probability $Pf_{RD}$ (also referred to a read failure rate) of the memory cell 302 biased at the supply voltage level SSL is shown. The access failure probability $Pf_{RD}$ can be expressed in, but is not limited to, a logarithmic scale.

In the present embodiments, different assist voltage levels $L_{W0}$-$L_{W5}$ are applied to the wordline WL to determine a plurality of probability values $Pf_{R0}$-$Pf_{R5}$ of the access failure probability $Pf_{RD}$, respectively. The relationship 404 can be determined by performing a linear regression on the assist voltage levels $L_{W0}$-$L_{W5}$ and the probability values $Pf_{R0}$-$Pf_{R5}$. It is worth noting that the relationship 404 can be determined using other estimation or statistical techniques, such as a nonlinear regression or a piecewise linear function, without departing from the scope of the present disclosure. Next, a reference probability value $Pf_{RP}$, which is a read failure rate of the memory cell 302 biased at another supply voltage level different from the supply voltage level SSL, can be used to determine the target assist voltage level $L_{WLUD}$ from the relationship 404.

For example, in some embodiments where the memory circuit 300 is configured to operate in the low supply voltage scenario LS1 shown in FIG. 1, the reference probability value $Pf_{RP}$ can represent the access failure probability of the memory cell 302 biased at 1.45V without read assists, and the relationship 404 can be a relationship between the read assist voltage $V_{WLUD}$ and the access failure probability $Pf_{RD}$ of the memory cell 302 biased at 1.35V with read assists. As a result, the target assist voltage level $L_{WLUD}$ can be determined according to the reference probability value $Pf_{RP}$ and the relationship 404. It is worth noting that the target assist voltage level $L_{WLUD}$ can be small compared to the predetermined supply voltage drop defined for read assists (100 mV). This means that the read assist unit 322 can provide assist the memory cell 302 in a read operation without overestimating the read assist strength.

Referring to FIG. 5 and also to FIG. 3, a relationship 504 between the write assist voltage $V_{NBL}$ and an access failure probability $Pf_{WE}$ (also referred to a write failure rate) of the memory cell 302 biased at the supply voltage level SSL is shown. The access failure probability $Pf_{WE}$ can be expressed in, but is not limited to, a logarithmic scale.

In the present embodiments, different assist voltage levels $L_{N0}$-$L_{N4}$ are applied to the bitline BL/BLB to determine a plurality of probability values $Pf_{W0}$-$Pf_{W4}$ of the access failure probability $Pf_{WE}$, respectively. Similarly, the relationship 504 can be determined by a linear regression on the assist voltage levels $L_{N0}$-$L_{N4}$ and the probability values $Pf_{R0}$-$Pf_{R5}$. Next, a reference probability value $Pf_{WP}$, which is a write failure rate of the memory cell 302 biased at another supply voltage level different from the supply voltage level SSL, can be used to determine the target assist voltage level $L_{NBL}$ from the relationship 504.

For example, in some embodiments where the memory circuit 300 is configured to operate in the low supply voltage scenario LS1 shown in FIG. 1, the reference probability value $Pf_{WP}$ can represent the access failure probability of the memory cell 302 biased at 1.55V without write assists, and the relationship 504 can be a relationship between the write assist voltage $V_{NBL}$ and the access failure probability $Pf_{WE}$ of the memory cell 302 biased at 1.35V with write assists. As a result, the target assist voltage level $L_{NBL}$ can be determined according to the reference probability value $Pf_{WP}$ and the relationship 504. It is worth noting that the target assist voltage level $L_{NBL}$ can be small compared to the predetermined supply voltage drop defined for write assists (200 mV). This means that the write assist unit 324 can provide assist the memory cell 302 in a write operation without overestimating the write assist strength.

Figure 6:
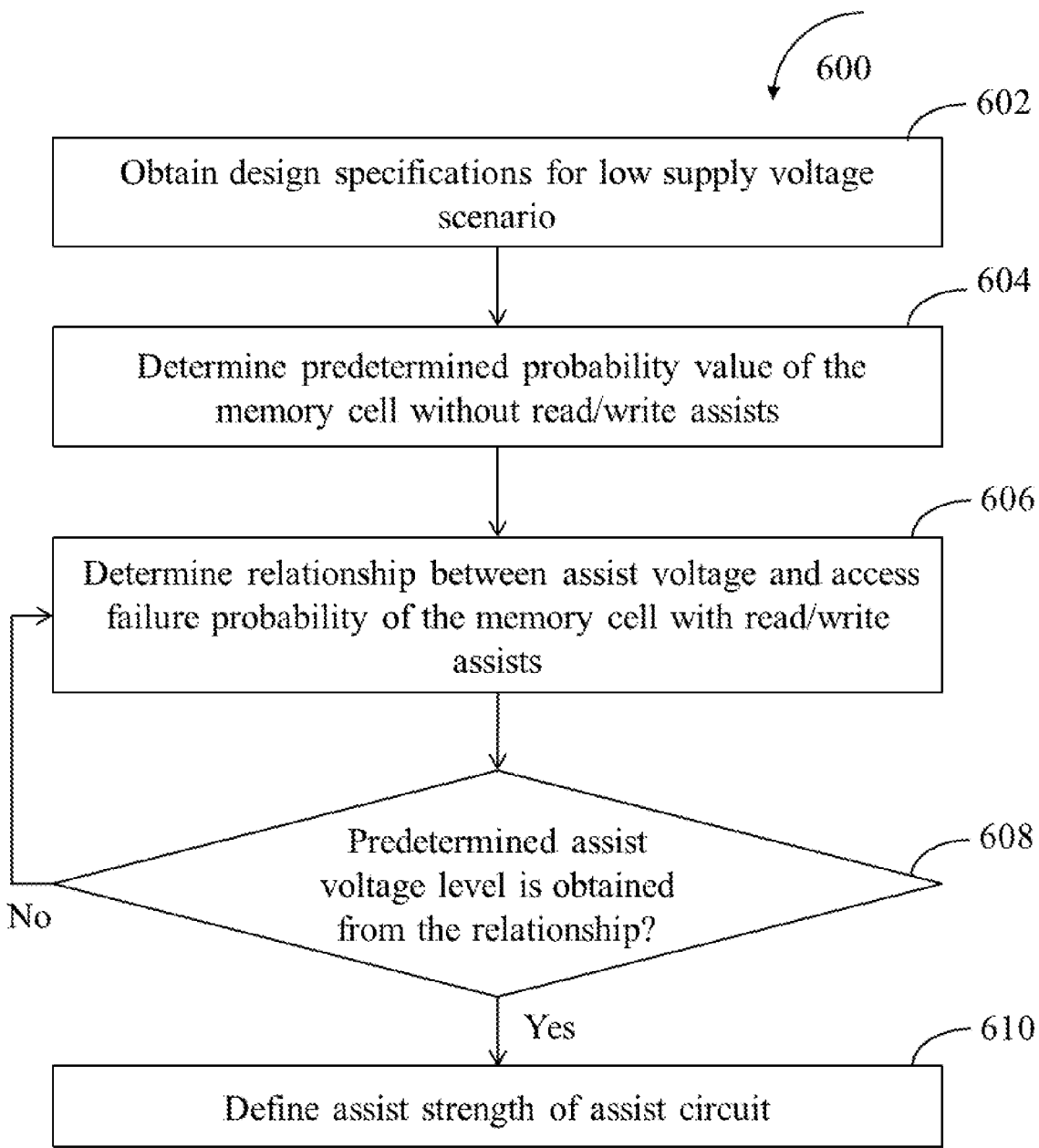
FIG. 6 is a flowchart of an exemplary method for determining assist strength of an assist circuit coupled to a memory cell in accordance with some embodiments of the present disclosure.

FIG. 6 is a flowchart of an exemplary method for determining assist strength of an assist circuit coupled to a memory cell in accordance with some embodiments of the present disclosure. For illustrative purposes, the method 600 is described with reference to the memory circuit 300 shown in FIG. 3 and the relationships shown in FIG. 4 and FIG. 5. Those skilled in the art will recognize that the method 600 can be employed in other types of memory circuits to define assist strength without departing from the scope of the present disclosure. Additionally, in some embodiments, other operations in the method 600 can be performed. In some other embodiments, operations of the method 600 can be performed in a different order and/or vary. In some other embodiments, one or more operations of the method 600 can be omitted.

At operation 602, design specifications for a low supply voltage scenario are obtained. The design specifications may include, but is not limited to, a nominal supply voltage level, a predetermined supply voltage drop for read assists, and a predetermined supply voltage drop for write assists. For example, when the memory circuit 300 is configured to operate in the low supply voltage scenario LS1 shown in FIG. 1, the nominal supply voltage level and the predetermined supply voltage drop for read/write assists, i.e. 1.5V and 100 mV/200 mV, can be provided for determining read/write assist strength of the assist circuit 320.

Please note that, in some embodiments, at least one of the read assist strength and the write assist strength can be determined by using simulation techniques or performing tests on physical memory cells. As a result, in some examples where the read/write assist strength designed for the low supply voltage scenario is determined using simulation techniques, the nominal supply voltage level and the predetermined supply voltage drop for read/write assists can be provided for a computer system or a processing unit. In some other examples where the read/write assist strength is determined by performing tests on physical memory cells, the nominal supply voltage level and the predetermined supply voltage drop for read/write assists can be provided for a test circuit coupled to the memory cells.

At operation 604, a reference probability value of the memory cell is determined, wherein the reference probability value represents an access failure probability of the memory cell which is applied by a first supply voltage level without read/write assists. For example, a supply voltage level different from the supply voltage level SSL is applied to the memory cell 302 to determine the reference probability value $Pf_{RP}$ shown in FIG. 4 or the reference probability value $Pf_{WP}$ shown in FIG. 5. Additionally, in some embodiments where the read/write assist strength is determined using simulation techniques, the reference probability value $Pf_{RP}$/$Pf_{WP}$ can be obtained by performing a statistical simulation, such as a Monte Carlo or Fast Monte Carlo simulation, to calculate the access failure probability of the memory cell 302.

At operation 606, a relationship between a read/write assist voltage and the access failure probability of the memory cell is determined, wherein the memory cell is applied by a second supply voltage level with read/write assists. For example, the relationship 404 between the read assist voltage $V_{WLUD}$ and the access failure probability $Pf_{RD}$ shown in FIG. 4, or the relationship 504 between the write assist voltage $V_{NBL}$ and the access failure probability $Pf_{WE}$ shown in FIG. 5, can be determined.

In some embodiments where the read/write assist strength is determined using simulation techniques, at least one of the relationship 404 shown in FIG. 4 and the relationship 504 shown in FIG. 5 can be determined using statistical simulations. For example, the probability values $Pf_{R0}$-$Pf_{R5}$ shown in FIG. 4 are calculated by performing a Monte Carlo or Fast Monte Carlo simulation, and the relationship 404 can be determined according to the assist voltage levels $L_{W0}$-$L_{W5}$ and the probability values $Pf_{R0}$-$Pf_{R5}$.

At operation 608, the reference probability value is used to determine if a target assist voltage level can be obtained from the relationship between the assist voltage and the access failure probability. If it is determined that the target assist voltage level corresponding to the reference probability value can be obtained from the relationship, the method 600 proceeds to operation 610; otherwise, the method 600 returns to operation 606, and applies other assist voltage levels to update the relationship. For example, as the reference probability value $Pf_{RP}$ shown in FIG. 4 is within the range between the probability values $Pf_{R0}$ and $Pf_{R5}$, the target assist voltage level $L_{WLUD}$ can be determined.

It is worth noting that, in some embodiments where a determined reference probability value lies outside the range between the probability values $Pf_{R0}$ and $Pf_{R5}$ shown in FIG. 4, the target assist voltage level $L_{WLUD}$ can be determined by an extrapolation technique. In these embodiments, the method 600 may not need to repeat operation 606.

At operation 610, the target assist voltage level is used to define the assist strength of the assist circuit. For example, the target assist voltage level $L_{WLUD}$ shown in FIG. 4 can be used to define the read assist strength of the assist circuit 320 shown in FIG. 3, and the target assist voltage level $L_{NBL}$ shown in FIG. 5 can be used to define the write assist strength of the assist circuit 320 shown in FIG. 3.

With the use of an assist circuit capable of providing predetermined/optimized assist strength, a memory device may operate at low supply voltage levels with improved power efficiency.

The above is for illustrative purposes only, and is not intended to limit the scope of the present disclosure. In some embodiments, the proposed assist circuit may be implemented as a read assist circuit or a write assist circuit without departing from the scope of the present disclosure. For example, the read assist unit 322 shown in FIG. 3 can be omitted in some embodiments, and the write assist unit 324 shown in FIG. 3 can be omitted in some other embodiments.

In some embodiments, the proposed access assist scheme may be applied across different technology nodes or different operating scenarios. By way of example but not limitation, the proposed access assist scheme may be applied to an advanced technology node where a supply voltage level, such as a nominal supply voltage or a target supply voltage as described with reference to FIG. 1, may be less than IV. As long as an access assist scheme capable of referring a relationship between an assist voltage and an access failure probability to provide suitable/optimized assist strength for given design specifications, associated alternatives and modifications fall within the scope of the present disclosure.

In some embodiments, the proposed assist circuit may refer to different assist specifications to dynamically provide assist strength. Referring to FIG. 3 again, the assist circuit 320 can be configured to adjust the target assist voltage level $V_{WLUD}/V_{NBL}$ according to the supply voltage level SSL and a predetermined supply voltage drop. For example, the control circuit 310 may provide control information CIN to the assist circuit 320, wherein the control information CIN may indicate design specifications including a supply voltage level and a predetermined supply voltage drop for read/write assists. When the control information CIN indicates the design specifications of a first low supply voltage scenario, the assist circuit 320 can provide a first target assist voltage level for read/write assists. When the control information CIN indicates the design specifications of a second low supply voltage scenario different from the first low supply voltage scenario, the assist circuit 320 can provide a second target assist voltage level different from the first target assist voltage level.

Figure 7:
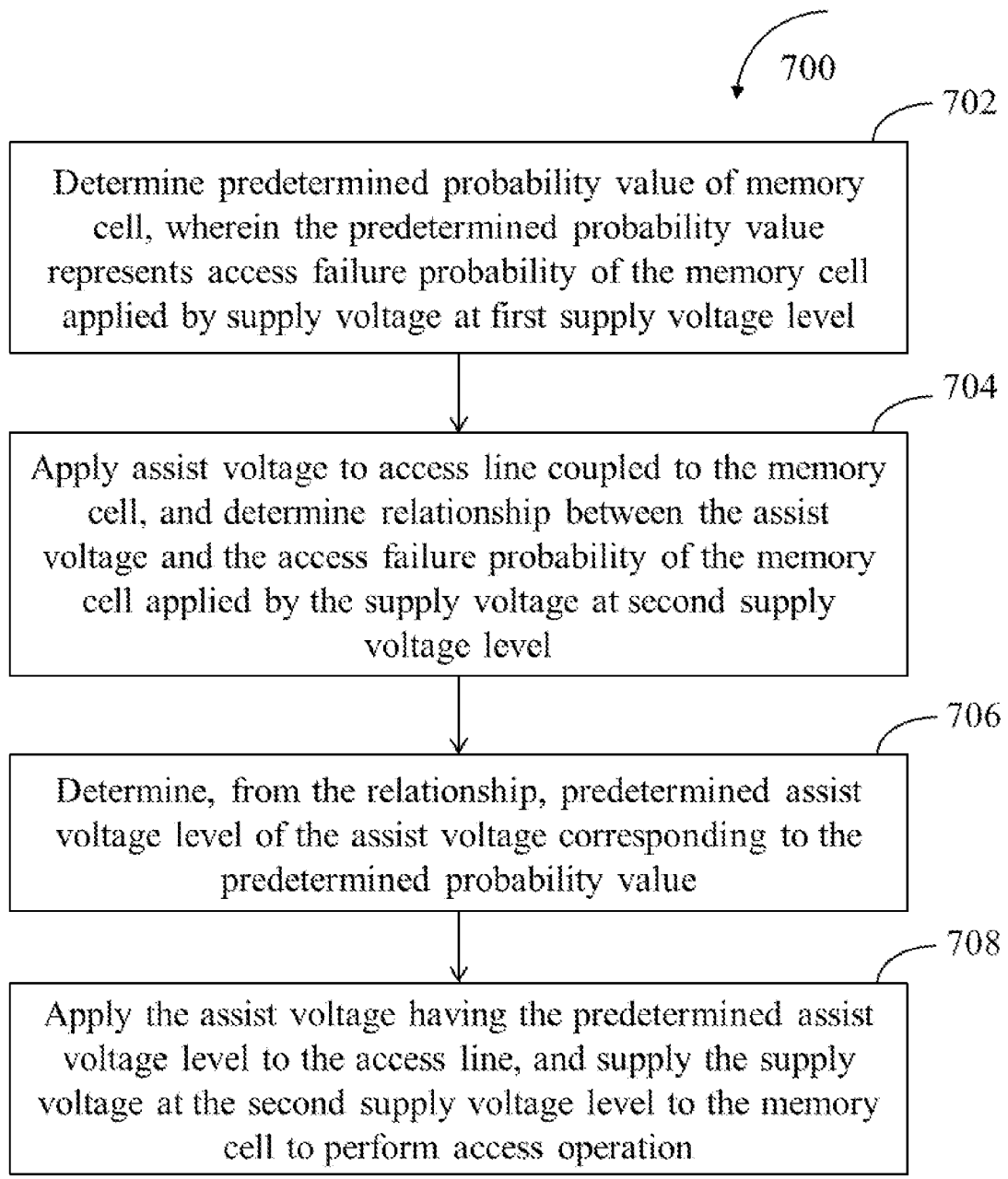
FIG. 7 is a flowchart of a method for operating a memory cell according to some embodiments of the present disclosure.

FIG. 7 is a flowchart of a method for operating a memory cell according to some embodiments of the present disclosure. The memory cell is supplied by a supply voltage to activate an access operation. For illustrative purposes, the method 700 is described with reference to the memory circuit 300 shown in FIG. 3, and the memory circuit 300 is configured to operate in the low supply voltage scenario LS1 shown in FIG. 1. Those skilled in the art will recognize that the method 700 can be utilized to operate other types of memory circuits in other scenarios without departing from the scope of the present disclosure. Additionally, in some embodiments, other operations in the method 200 can be performed. In some embodiments, operations of the method 200 can be performed in a different order and/or vary.

At operation 702, a reference probability value of the memory cell is determined. The reference probability value represents an access failure probability of the memory cell applied by the supply voltage at a first supply voltage level. For example, a reference probability value of the memory cell 302 biased at 1.45V/1.55V without read/write assists is determined.

At operation 704, an access line coupled to the memory cell is applied by an assist voltage, and a relationship between the assist voltage and the access failure probability of the memory cell applied by a second supply voltage level is determined. For example, the wordline WL is applied by the read assist voltage $V_{WLUD}$, and a relationship between the assist voltage $V_{WLUD}$ and the access failure probability of the memory cell 302 biased at 1.35V is determined.

At operation 706, a target assist voltage level of the assist voltage is determined from the relationship according to the reference probability value. For example, the target assist voltage level $L_{WLUD}$, corresponding to the reference probability value of the memory cell 302, is determined from the relationship.

At operation 708, the assist voltage having the target assist voltage level is applied to the access line, and the supply voltage at the second supply voltage level is supplied to the memory cell to perform the access operation. For example, when the control circuit 310 supplies the supply voltage level SSL to wordline 302 to activate a read operation, the assist circuit 320 may apply the target assist voltage level $L_{WLUD}$ to wordline WL to assist the memory cell 302 in the read operation. In another example, when the control circuit 310 supplies the supply voltage level SSL to wordline 302 to activate a write operation, the assist circuit 320 may apply the target assist voltage level $L_{NBL}$ to bitline BL to assist the memory cell 302 in the write operation.

As those skilled in the art should understand each operation in the method 700 after reading the above paragraphs directed to FIGS. 1-6, further description is omitted for the sake of brevity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for assisting a memory cell in an access operation, the access operation being activated in response to a supply voltage supplied to the memory cell, the method comprising:

setting the supply voltage to a first supply voltage level to determine a reference probability value, the reference probability value representing an access failure probability of the memory cell applied by the first supply voltage level;

applying an assist voltage to an access line coupled to the memory cell, and setting the supply voltage to a second supply voltage level to determine a relationship between the assist voltage and the access failure probability of the memory cell applied by the second supply voltage level, the second supply voltage level being different from the first supply voltage level;

determining, from the relationship, a target assist voltage level of the assist voltage corresponding to the reference probability value; and providing an assist circuit configured to apply the target assist voltage level to the access line during the access operation, wherein the memory cell is applied by the second supply voltage level during the access operation.

2. The method of claim 1, wherein setting the supply voltage to the first supply voltage level to determine the reference probability value comprises:

performing a statistical simulation to calculate the access failure probability of the memory cell applied by the first supply voltage level, and obtaining the reference probability value.

3. The method of claim 1, wherein determine the relationship between the assist voltage and the access failure probability of the memory cell applied by the second supply voltage level comprises:

applying the assist voltage of different assist voltage levels to the access line to determine a plurality of probability values of the access failure probability of the memory cell, respectively; and performing a linear regression on the assist voltage levels and the probability values to determine the relationship between the assist voltage and the access failure probability of the memory cell.

4. The method of claim 1, wherein determine the relationship between the assist voltage and the access failure probability of the memory cell applied by the second supply voltage level comprises:

performing statistical simulations to calculate a plurality of probability values of the access failure probability of the memory cell applied by the second supply voltage level, wherein the probability values correspond to different assist voltage levels applied to the access line, respectively; and determining the relationship between the assist voltage and the access failure probability of the memory cell according to the different assist voltage levels and the probability values.

5. The method of claim 1, wherein the first supply voltage level is greater than the second supply voltage level.

6. The method of claim 5, further comprising:

calculating the first supply voltage level by adding the second voltage level and a predetermined supply voltage drop.

7. The method of claim 1, wherein the access operation is a read operation, the access line is a wordline coupled to the memory cell, and the supply voltage is supplied to the memory cell through the wordline.

8. The method of claim 1, wherein the access operation is a write operation, the access line is a bitline coupled to the memory cell, and the supply voltage is supplied to the memory cell through a wordline coupled to the memory cell.

9. A memory circuit, comprising:

an access line;

a memory cell, coupled to the access line, wherein an access failure probability of the memory cell is equal to a reference probability value when the memory cell is applied by a supply voltage at a first supply voltage level;

a control circuit, coupled to the memory cell, the control circuit configured to provide the supply voltage to the memory cell to activate an access operation, wherein during the access operation, the control circuit is configured to apply the supply voltage at a second supply voltage level to the memory cell, and the second supply voltage level is different from the first supply voltage level; and an assist circuit, coupled to the access line, wherein during the access operation, the assist circuit is configured to apply an assist voltage having a target assist voltage level to the access line, such that the access failure probability of the memory cell applied by the second supply voltage level is equal to the reference probability value.

10. The memory circuit of claim 9, wherein the assist circuit is configured to provide the assist voltage having the target assist voltage level according to the reference probability value and a relationship between the assist voltage and the access failure probability of the memory cell applied by the second supply voltage level.

11. The memory circuit of claim 10, wherein the first supply voltage level is a sum of the second supply voltage level and a predetermined supply voltage drop; and the assist circuit is configured to adjust the target assist voltage level according to the second supply voltage level and the predetermined supply voltage drop.

12. The memory circuit of claim 9, wherein the access operation is a read operation and the access line is a wordline coupled to the memory cell; the control circuit is configured to apply the supply voltage to the memory cell through the wordline.

13. The memory circuit of claim 9, wherein the access operation is a write operation and the access line is a bitline coupled to the memory cell; the memory circuit further comprises a wordline, and the control circuit is configured to apply the supply voltage to the memory cell through the wordline.

14. A method for operating a memory cell, the memory cell being supplied by a supply voltage to activate an access operation, comprising:

determining a reference probability value of the memory cell, the reference probability value representing an access failure probability of the memory cell applied by the supply voltage at a first supply voltage level;

applying an assist voltage to an access line coupled to the memory cell, and determining a relationship between the assist voltage and the access failure probability of the memory cell applied by the supply voltage at a second supply voltage level, the second supply voltage level being different from the first supply voltage level;

determining, from the relationship, a target assist voltage level of the assist voltage corresponding to the reference probability value; and applying the assist voltage having the target assist voltage level to the access line, and supplying the supply voltage at the second supply voltage level to the memory cell to perform the access operation.

15. The method of claim 14, wherein determining the reference probability value of the memory cell comprises:

performing a statistical simulation to calculate the access failure probability of the memory cell applied by the first supply voltage level, and obtaining the reference probability value.

16. The method of claim 14, wherein determining the relationship between the assist voltage and the access failure probability of the memory cell applied by the second supply voltage level comprises:

applying the assist voltage of different assist voltage levels to the access line to determine a plurality of probability values of the access failure probability of the memory cell, respectively; and performing a linear regression on the assist voltage levels and the probability values to determine the relationship between the assist voltage and the access failure probability of the memory cell.

17. The method of claim 14, wherein determining the relationship between the assist voltage and the access failure probability of the memory cell applied by the second supply voltage level comprises:

performing statistical simulations to calculate a plurality of probability values of the access failure probability of the memory cell applied by the second supply voltage level, wherein the probability values correspond to different assist voltage levels applied to the access line, respectively; and determining the relationship between the assist voltage and the access failure probability of the memory cell according to the different assist voltage levels and the probability values.

18. The method of claim 14, further comprising:

calculating the first supply voltage level by adding the second voltage level and a predetermined supply voltage drop.

19. The method of claim 14, wherein the access operation is a read operation and the access line is a wordline; and performing the access operation comprises:

reading data stored in the memory cell by applying the target assist voltage level and the second supply voltage level to the wordline.

20. The method of claim 14, wherein the access operation is a write operation and the access line is a bitline; and performing the access operation comprises:

writing data into the memory cell by applying the second supply voltage level to a wordline coupled to the memory cell and applying the predetermined voltage level to the bitline.

\* \* \* \* \*